Figure 1:
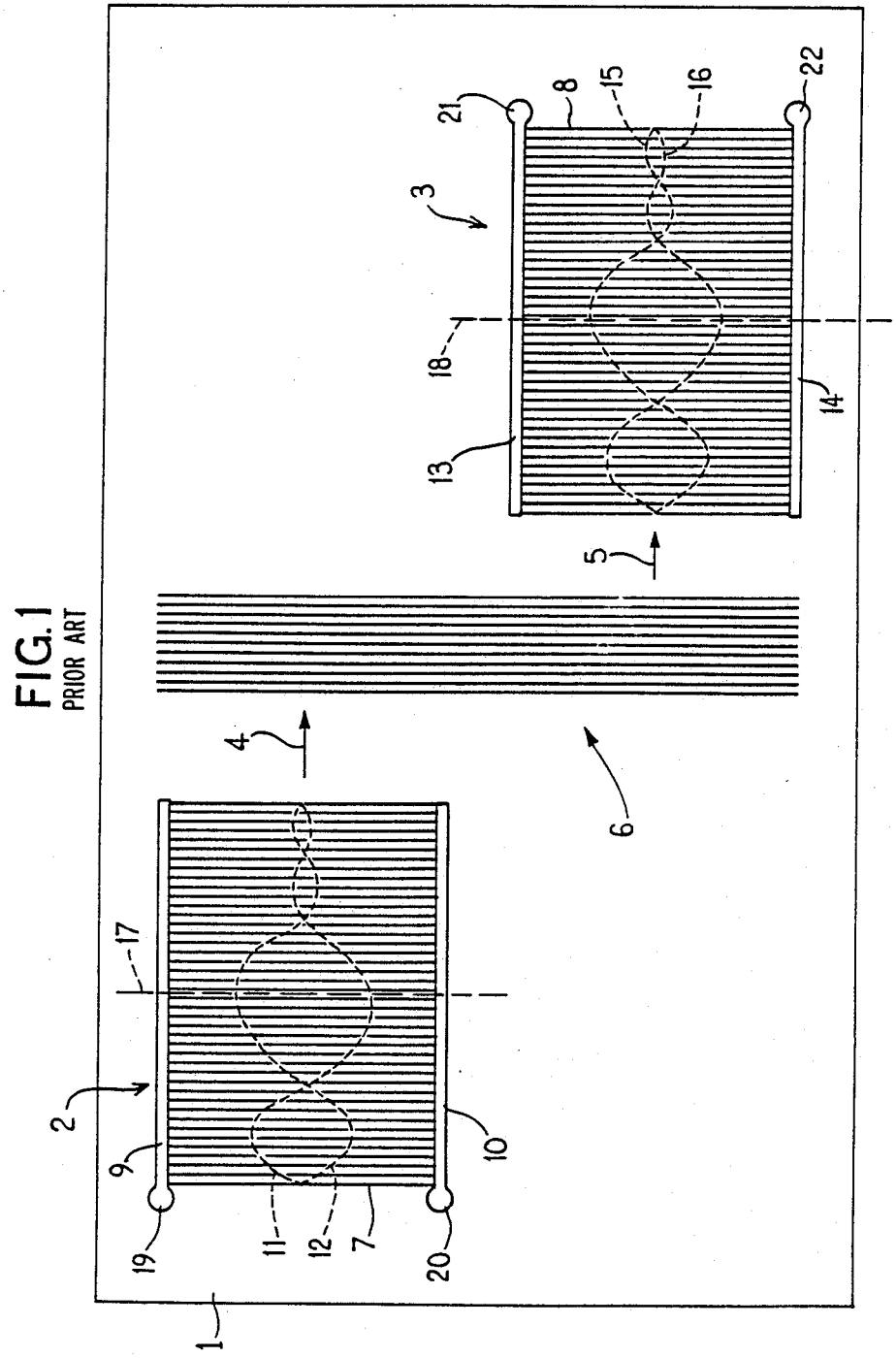

United States Patent [19]

Mitchell et al.

[11] Patent Number: 4,910,483

[45] Date of Patent: Mar. 20, 1990

[54] ACOUSTIC SURFACE WAVE FILTER DEVICE WITH ASYMMETRIC TRANSDUCERS AND METHOD OF MANUFACTURING SAME

[75] Inventors: Richard F. Mitchell, Cambridge; Paul A. Moore, Hove, both of England

[73] Assignee: U.S. Philips Corporation, New York, N.Y.

[21] Appl. No.: 720,191

[22] Filed: Apr. 5, 1985

[30] Foreign Application Priority Data

Apr. 9, 1984 [GB] United Kingdom ............... 8409138

[51] Int. Cl.$^4$ ............................................. H03H 9/64
[52] U.S. Cl. ................................. 333/196; 310/313 C; 310/313 D
[58] Field of Search ............... 333/150, 153, 154, 193, 333/195, 196; 310/313 R, 313 D

[56] References Cited

U.S. PATENT DOCUMENTS

| | | | |
|---|---|---|---|
| 3,670,186 | 6/1972 | Hobden et al. | 310/313 C |
| 3,768,032 | 10/1973 | Mitchell | 333/154 |
| 4,023,124 | 5/1977 | Parker et al. | 333/196 |
| 4,146,851 | 3/1979 | Dempsey et al. | 333/153 X |
| 4,472,653 | 9/1984 | Yamada | 310/313 C |

FOREIGN PATENT DOCUMENTS 74781 3/1983 European Pat. Off.
1351286 4/1974 United Kingdom ............... 333/196

OTHER PUBLICATIONS

Morimoto et al.; "An Optional SAW Filter Design Using FIR Design Technique"; *Proc. IEEE Ultrasonic Symposium*, 1980; pp. 298–301.

Schoenwald, Jeffrey S.; "Asymmetrically Truncated SAW Transducer"; *IEEE Trans. On. Sonics and Ultrasonics;* vol. SU-25, No. 5; Sep. 1978; pp. 320–324.

*Primary Examiner*—Eugene R. LaRoche
*Assistant Examiner*—Benny Lee
*Attorney, Agent, or Firm*—Bernard Franzblau

[57] ABSTRACT

In order to obtain greater flexibility in the design of a linear-phase electrical filter comprising an acoustic surface wave device including a pair of apodized transducers intercoupled by means of a multi-strip coupler, for example to obtain more equal contributions by the two transducers to the gain versus frequency characteristic of the filter, the transducers are apodized differently but have mutually complementary non-linear phase characteristics. First a transfer characteristic corresponding to the collective contribution to the desired overall gain versus frequency characteristic of the filter, is derived in terms of the z-transform and the roots or the reciprocals of the roots of the resulting polynomial in $z^{-1}$ are found. These roots or reciprocals are then divided into two groups so that at least one pair of non-identical roots or reciprocals which have equal ratios between their real and imaginary parts and the product of the moduli of which is equal to unity are included one in each group. Two further polynomials are then found which have as their roots or the reciprocals of their roots those of the first group and those of the second group. The two transducers include successive active electrode pairs which have relative weights proportional to the coefficients of the successively increasing powers of the variable in one further polynomial and the variable in the other further polynomial. The active electrode pairs are connected with polarities in accordance with the signs of the corresponding coefficients.

11 Claims, 5 Drawing Sheets

ACOUSTIC SURFACE WAVE FILTER DEVICE WITH ASYMMETRIC TRANSDUCERS AND METHOD OF MANUFACTURING SAME

This invention relates to an electrical filter comprising an acoustic surface wave device comprising a piezo-electric substrate for propagating acoustic surface waves at a surface thereof, a first electro-acoustic transducer formed on said surface for launching acoustic surface waves along a propagation path at said surface, and a second electro-acoustic transducer formed on said surface for receiving acoustic surface waves propagating along said path, each transducer comprising an interdigital array of electrodes which extend at right angles to the length direction of the propagation path where said path adjoins the relevant transducer and being apodized so as to shape the gain versus frequency characteristic of the filter while maintaining the delay imparted by the filter substantially independent of frequency. The device provides that the collective contribution of the gain versus frequency characteristics of the two transducers to the overall gain versus frequency characteristic of the filter is substantially equal to the product of the gain versus frequency characteristics of the two transducers. The invention also relates to a method of manufacturing such a filter.

Figure 3:
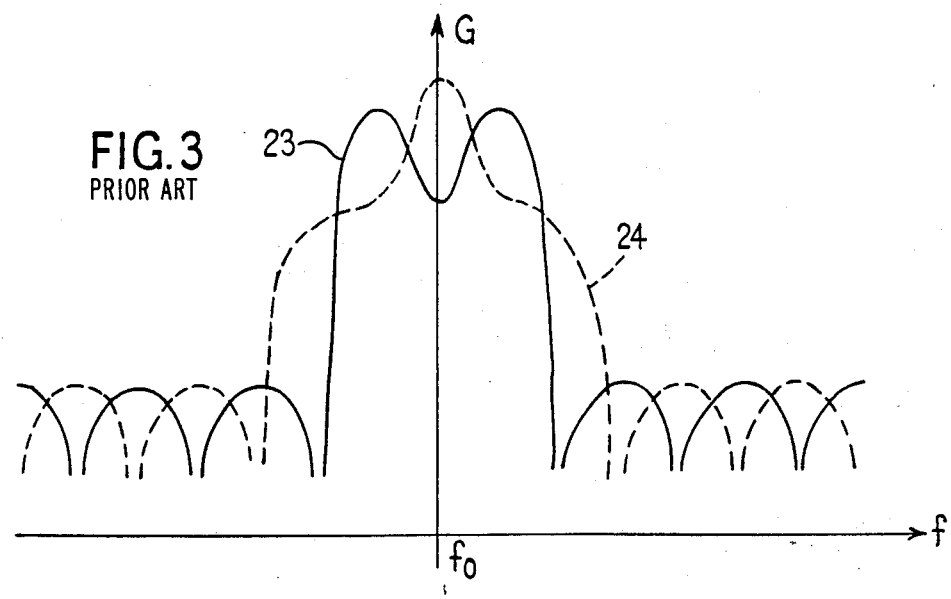

A filter of the above kind, sometimes called a "linear-phase filter", is known, for example, from FIG. 3.8 on page 71 of the book "Acoustic Surface Waves", editor A. A. Oliner, published by Springer-Verlag (1978). An example is shown in FIG. 1 of the accompanying diagrammatic drawings. In FIG. 1 an electrical filter is in the form of an acoustic surface wave device comprising a piezo-electric substrate 1 for propagating acoustic surface waves at a surface thereof, a first electro-acoustic transducer 2 formed on said surface for launching acoustic surface waves along a propagation path at said surface, and a second electro-acoustic transducer 3 formed on said surface for receiving acoustic surface wave energy propagating along said path. First and second portions of the propagation path are denoted by arrows 4 and 5 respectively, and a multistrip coupler 6 is formed on said surface for receiving acoustic surface wave energy propagating along the portion 4 and re-launching at least part of that energy along the portion 5. Each transducer comprises an interdigital array of electrodes 7 and 8 respectively which extend at right angles to the length direction of the propagation path where the path adjoins the relevant transducer. Moreover, each transducer is apodized so as to shape the gain (which will be less than unity) versus frequency characteristic of the filter. (For a discussion of this see, for example, the above-mentioned book). More specifically in, for example, transducer 2, the overlaps between those electrodes 7 which are connected to a bus-bar 9 and the adjoining electrodes 7 which are connected to a bus-bar 10 vary along the length of the transducer, the envelope of these overlaps being denoted by the dashed lines 11 and 12. Similarly, in transducer 3 the overlaps between those electrodes 8 which are connected to a bus-bar 13 and the adjoining electrodes which are connected to a bus-bar 14 vary along the length of the transducer in a manner that produces the envelope denoted by the dashed lines 15 and 16. The multi-strip coupler 6 (which it will be assumed has in itself a linear-phase characteristic and which may alternatively be of the reflective type if both transducers are situated on the same side thereof) is provided to transform the spatially weighted acoustic wavefront generated (because of the apodisation) by the input transducer 2 to a spatially uniform but amplitude-weighted acoustic wave for reception by the output transducer 3. If it were not present and the transducers 2 and 3 were simply aligned, the collective contribution of the gain versus frequency characteristics of the two transducers to the overall gain versus frequency characteristic of the filter would not be substantially equal to the product of the gain versus frequency characteristics of the two transducers as required.

It will be seen that the envelope 11, 12 is not symmetrical about the middle 17 of the transducer 2, nor is the envelope 15, 16 symmetrical about the middle 18 of the transducer 3. Because of this neither the transducer 2 nor the transducer 3 is of the linear-phase type. The delay which is imparted by each to a transduced signal varies with the frequency of that signal. However, both transducers are identical and, because of this, the overall delay imparted by the filter (from input 19, 20 to output 21, 22) is substantially independent of frequency. The phase characteristics of the two transducers are complementary.

The use of two identical apodized transducers is inefficient in that it is liable to require a larger number of electrodes in the two transducers to achieve a given collective contribution of the gain versus frequency characteristics of the two transducers to the overall gain versus frequency characteristic of the filter than would be required if each were to contribute different features to the characteristic. Thus, for example, the nulls in the characteristic produced by one transducer (by means of respective electrode pairs) coincide in frequency with the nulls produced by the other transducer (again by means of respective electrode pairs), which is a very inefficient use of the various electrode pairs.

An alternative, more efficient way of obtaining a desired collective contribution of the gain versus frequency characteristics of the two transducers to the overall gain versus frequency characteristic is to make the two transducers non-identical so that each contributes different features to the characteristic, the required linear-phase property of the filter now being ensured by making each transducer itself of a linear-phase type (implying that envelope 11, 12 is now symmetrical about the middle 17 of transducer 2 and envelope 15, 16 is now symmetrical about the middle 18 of transducer 3). Such a filter is known, for example, from the article entitled "An optimal SAW filter design using FIR design technique" by M. Morimoto, Y. Kobayashi and M. Hibno published in the proceedings of the IEEE Ultrasonics Symposium 1980, pages 298–301. It is known that the collective contribution of the two transducers to the overall filter response in a given case can be written in terms of the $$z\text{-transform as } H(z) = \sum_{i=0}^{N} a_i z^{-i} \qquad (1)$$

where the $a_i$ are the $N+1$ tap weights (related to the degrees of overlap of the corresponding finger pairs) determined from the frequency response design objective by means, for example, of the so-called Remetz-Exchange method (see for example the article by L. R. Rabiner, J. H. McClellan and T. W. Parks in Proc.

Figure 2:
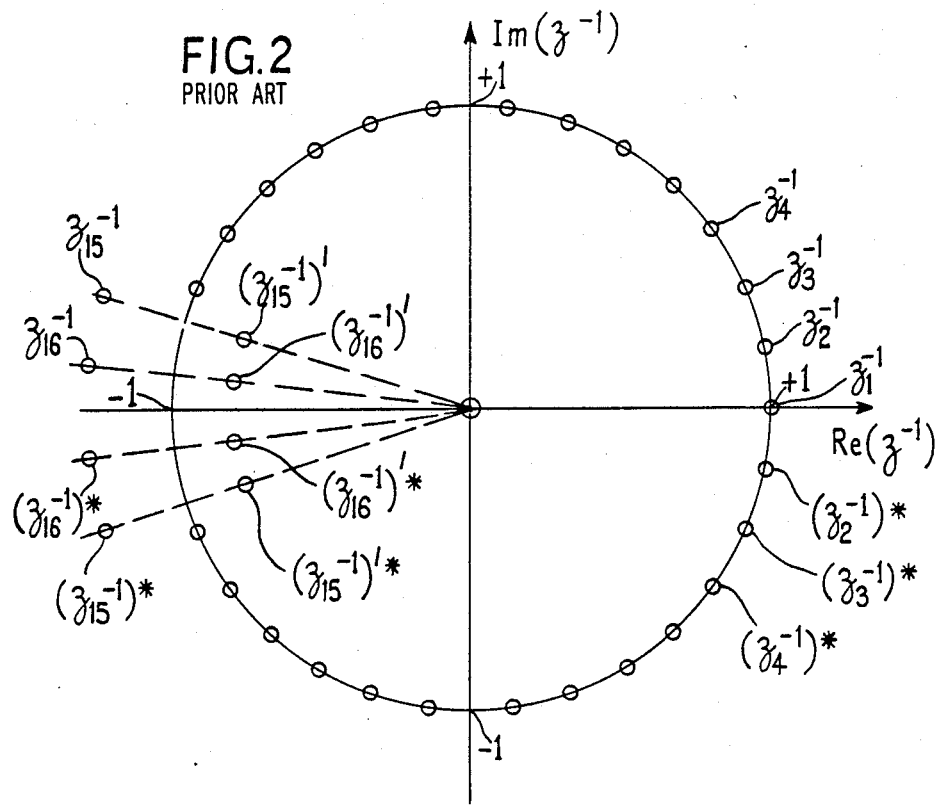

IEEE Vol. 63 No. 4, Apr.1975, page 595 et. seq.). An alternative expression to (1) is $$H(z) = \prod_{i=1}^{N} (z^{-1} - z_i^{-1}) \quad (2)$$

where the $z_i^{-1}$ are the N zeros of the response in the $z^{-1}$ domain. Since the $a_i$ are all real the zeros are either real or occur in complex conjugate pairs. FIG. 2 of the accompanying drawings shows an example of how the zeros may be distributed in the $z^{-1}$-domain for a collective contribution which is band-pass linear-phase, the real part of $z^{-1}$ ($\text{Re}(z^{-1})$) being plotted along the horizontal axis and the imaginary part of $z^{-1}$ ($\text{Im}(z^{-1})$) being plotted along the vertical axis. In the example shown there is one real zero ($z_1^{-1}$) and all the other zeros occur in complex conjugate pairs ($z_1^{-1}$, ($z_1^{-1}$)*;$z_2^{-1}$, ($z_2^{-1}$)* etc.). Most of the zeros lie on the unit circle $|z^{-1}|=1$. These determine the out-of-band portion of the collective contribution to the filter characteristic. The in-band portion of the contribution is determined by the eight zeros $z_{15}^{-1}$,($z_{15}^{-1}$)',$z_{16}^{-1}$,($z_{16}^{-1}$)',($z_{15}^{-1}$)*,($z_{15}^{-1}$)'*,($z_{16}^{-1}$)* and ($z_{16}^{-1}$)'* which, it will be noted, occur in pairs $z_{15}^{-1}$,($z_{15}^{-1}$)' etc which lie on the same respective ray from the origin 0 (which means that the two zeros of each pair have equal ratios between their real and imaginary parts). In fact the product of the distances from the origin (the moduli) of the two zeros of each pair is always equal to unity. The occurrence in such pairs of those zeros which do not lie on the unit circle is a consequence of the fact that the collective contribution to the transfer characteristic is a linear-phase one.

According to the aforementioned paper by Morimoto et al, one set of alternate zeros, for example $z_1^{-1}$, $z_3^{-1}$, $z_5^{-1}$, ... $z_{15}^{-1}$,($z_{15}^{-1}$)', together with their complex conjugates, are implemented in one transducer (by means of a suitable number of electrodes and suitable apodization) and the other set of alternate zeros, i.e. $z_2^{-1}$, $z_4^{-1}$, $z_6^{-1}$ ... $z_{16}^{-1}$, ($z_{16}^{-1}$)', together with their complex conjugates, are similarly implemented in the other transducer. The result of this is that each transducer contributes different features to the gain versus frequency characteristic of the overall device, for example in the manner shown in FIG. 3 which shows the contributions to the overall frequency characteristic around the centre-frequency $f_o$ of the device response made by that transducer in which the even-numbered zeros of FIG. 2 are implemented (curve 23 in full lines) and that transducer in which the odd-numbered zeros of FIG. 2 are implemented (curve 24 in dashed lines). The relative gain G is plotted along the vertical axis in dB and the overall characteristic of the device is the product of the characteristics of the two transducers (in fact modified by the characteristic, if significant, of the multi-strip coupler 6). The central trough in curve 23 arises from the four zeros $z_{16}^{-1}$,($z_{16}^{-1}$)',($z_{16}^{-1}$)* and ($z_{16}^{-1}$)'* in FIG. 2, this being balanced in the overall characteristic by the central hump in the curve 24 (the points of inflection on either side of which arise from the pairs of zeros $z_{15}^{-1}$, ($z_{15}^{-1}$)'and ($z_{15}^{-1}$)*, ($z_{15}^{-1}$)'* respectively in FIG. 2). At frequencies further removed from $f_o$ nulls in the curve 23 (arising from the even-numbered zeros $z_{14}^{-1}$,($z_{14}^{-1}$)*, $z_{12}^{-1}$, ($z_{12}^{-1}$)* etc) alternate with nulls in the curve 24 (arising from the odd-numbered zeros $z_{13}^{-1}$, ($z_{13}^{-1}$)*, $z_{11}^{-1}$,($z_{11}^{-1}$)* etc), each null in one curve coinciding in frequency with a peak in the other. Because the zeros of each pair which, in FIG. 2, lie on a common ray from the origin 0 are both implemented in the same transducer, each transducer is of the linear-phase (delay independent of frequency) type, so that the overall device is also of the linear phase type as required, even though the two transducers 2 and 3 are apodized differently.

It has been found that distributing the implementations of the various zeros between the two transducers in the manner described with reference to FIGS. 2 and 3 is in many cases non-ideal. For example, in FIG. 3 the curves 23 and 24 are very dissimilar for frequencies between those at which the first two nulls closest to $f_o$ occur, whereas it is often desirable that both transducers contribute fairly equally to the characteristic of the overall device. It is an object of the invention to mitigate this disadvantage.

According to one aspect the invention provides an electrical filter comprising an acoustic surface wave device, said device comprising a piezo-electric substrate for propagating acoustic surface waves at a surface thereof, a first electro-acoustic transducer formed on said surface for launching acoustic surface waves along a propagation path at said surface, and a second electro-acoustic transducer formed on said surface for receiving acoustic surface waves propagating along said path, each transducer comprising an interdigital array of electrodes which extend at right angles to the length direction of the propagation path where said path adjoins the relevant transducer. Each transducer is apodized so as to shape the gain versus frequency characteristic of the filter while maintaining the delay imparted by the filter substantially independent of frequency. The device is such that the collective contribution of the gain versus frequency characteristics of the two transducers to the overall gain versus frequency characteristic of the filter is substantially equal to the product of the gain versus frequency characteristics of the two transducers. The device is characterized in that the apodization of each transducer is different from that of the other and is non-symmetrical about the middle of the corresponding transducer.

It has now been recognised that, in order that the delay imparted by the filter should be substantially independent of frequency, it is not necessary that both transducers either have a linear-phase charcteristic (obtained by making the apodization of each symmetrical about the middle of the corresponding transducer) or are apodized identically. It is possible to apodize them differently while at the same time giving them mutually complementary non-linear phase characteristics such that the device overall has a substantially linear-phase characteristic. This results in greater flexibility in the way that a desired collective contribution by the transducers to the overall gain versus frequency characteristic can be obtained by choosing suitable gain versus frequency characteristics for the two transducers. For example, referring to FIG. 2, giving both transducers non-linear but complementary phase characteristics implies that the zeros of at least one of the pairs of zeros which lie on a common ray from the origin 0 are implemented one in one and one in the other of the transducers. (In fact it implies that the zeros of at least two such pairs are so implemented because each zero must be implemented in the same transducer as is its complex conjugate). Thus the number of ways that the gain versus frequency characteristics of the two transducers can be chosen has been multiplied by four in the example of FIG. 2. If, for example, zero $z_{16}^{-1}$ is implemented in one transducer and zero $(z_{16}^{-1})'$ in the other, implying that zero $(z_{16}^{-1})^*$ is implemented in the one transducer and zero $(z_{16}^{-1})'^*$ in the other, the peak heights of the curves 23 and 24 of FIG. 3 will occur at substantially the same frequency $f_o$, resulting in much more equal contributions to the overall gain versus frequency characteristic of the device by the input and output transducers without causing the delay imparted by the device to signals filtered thereby to become dependent on frequency (because, although each transducer is no longer linear-phase, the phase characteristics of the two transducers become complementary).

If those zeros in FIG. 2 which do not lie on the unit circle were clustered about the negative imaginary axis instead of about the negative real axis the number of ways the implementations of these zeros could be distributed between the transducers would be increased to $2^8$ (because one half of these zeros would no longer be the complex conjugates of the other half and have to be implemented in the same transducer as their complex conjugates). In order to obtain an increase in flexibility of this kind preferably the pitch of the electrodes of each transducer is equal to one quarter of the wavelength of surface acoustic waves which would be launched at said surface by said first transducer should an electrical signal having a frequency equal to the centre-frequency of the response of said filter be applied to said first transducer. The pitch of the electrodes is the center-to-center distance between adjacent electrodes measured parallel to the propagation path.

The invention also provides a method of manufacturing such an electrical filter, including the steps of calculating in terms of the z-transform a linear-phase transfer function which corresponds to a gain versus frequency characteristic which is the collective contribution of the two transducers to the desired overall gain versus frequency characteristic of the filter finding the N roots, or the reciprocals of the N roots, of the polynomial in $z^{-1}$ which constitutes said transfer function, dividing or arranging the N roots or reciprocals thus found into a first group of L roots or reciprocals and a second group of M roots or reciprocals in such manner that the first and second groups are non-identical and the members of at least one pair of non-identical roots or reciprocals which have equal ratios between their real and imaginary parts and the product of the moduli of which is equal to unity are included one in each group and the roots or reciprocals of each conjugate pair are both included in the same group, forming first and second further polynomials the roots or the reciprocals of the roots of which are constituted by those of the first group and those of the second group respectively, and forming the first and second electro-acoustic transducers with $L+1$ and $M+1$ active electrode pairs respectively and apodized so that the relative weights of the elementary surface acoustic wave sources formed by the successive active pairs of the first transducer and the relative weights of the elementary surface acoustic wave detectors formed by the successive active pairs of the second transducer are directly proportional to the magnitudes of the coefficients of the successively increasing power (including zero) of the variable in the first further polynomial and the magnitudes of the coefficients of the successively increasing powers (including zero) of the variable in the second further polynomial respectively and the relative polarities of said active pairs conform with the signs of the corresponding said coefficients. (L may or may not be chosen to be equal to M. Moreover the various weights corresponding to one transducer may, if desired, be scaled by an arbitrary but common factor relative to the various weights corresponding to the other transducer. The groups are non-identical in that there is at least one root or reciprocal in one group that does not have an identical root or reciprocal in the other group.

Figure 4:
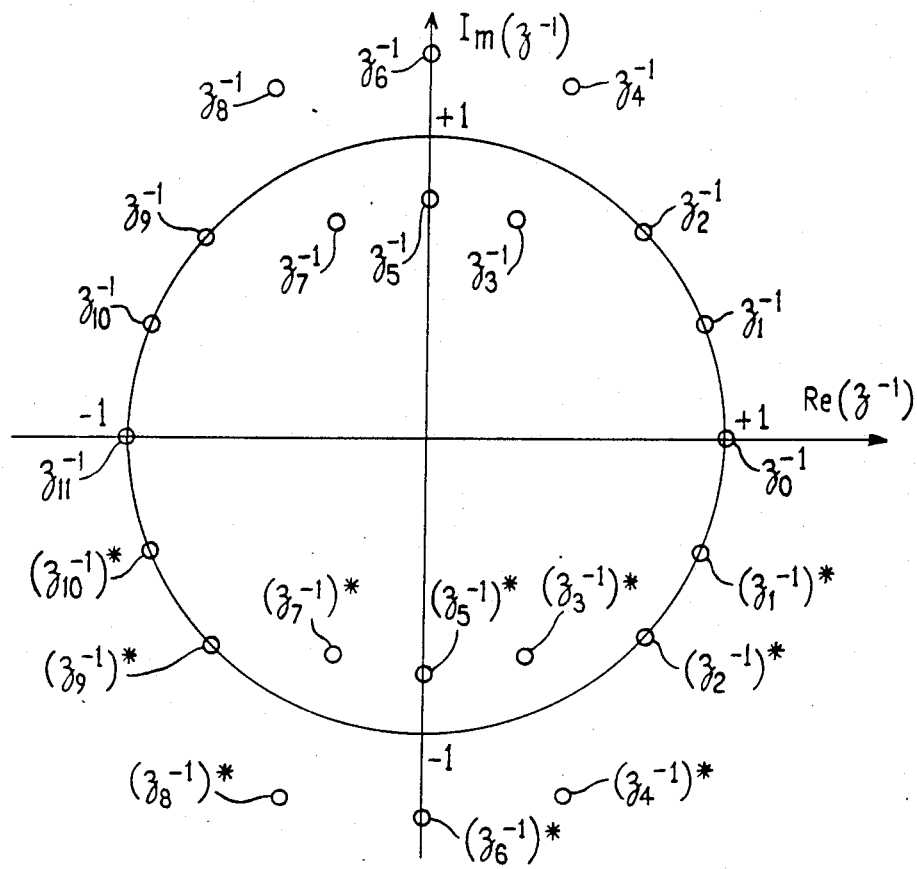
Figure 5:
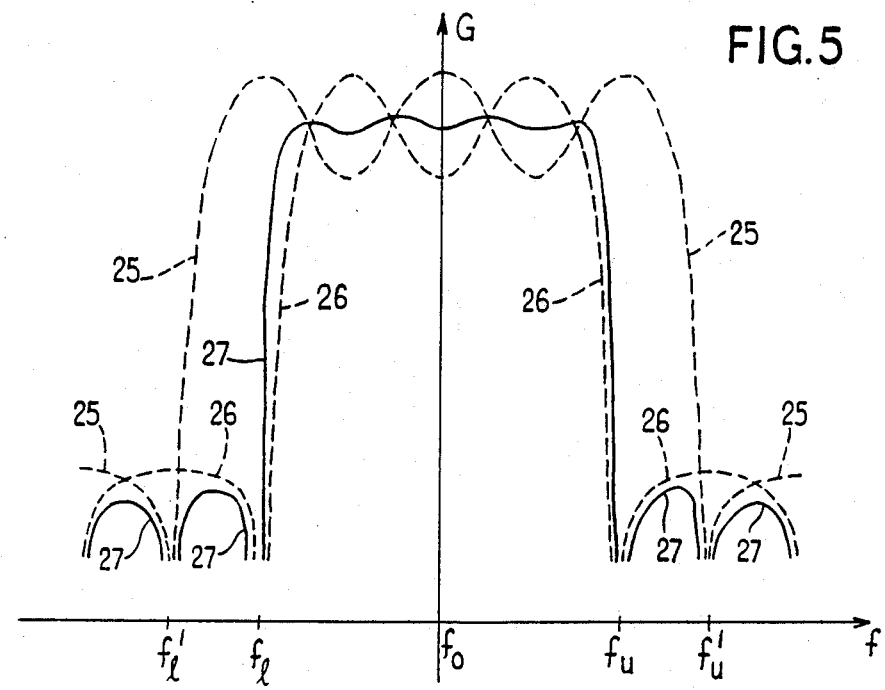
Figure 6:
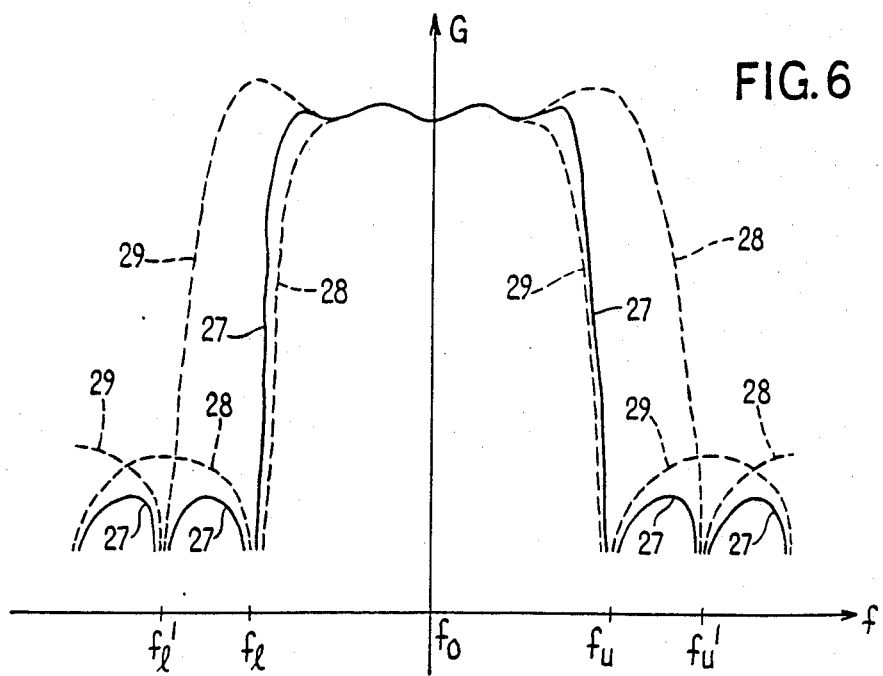
Figure 7:
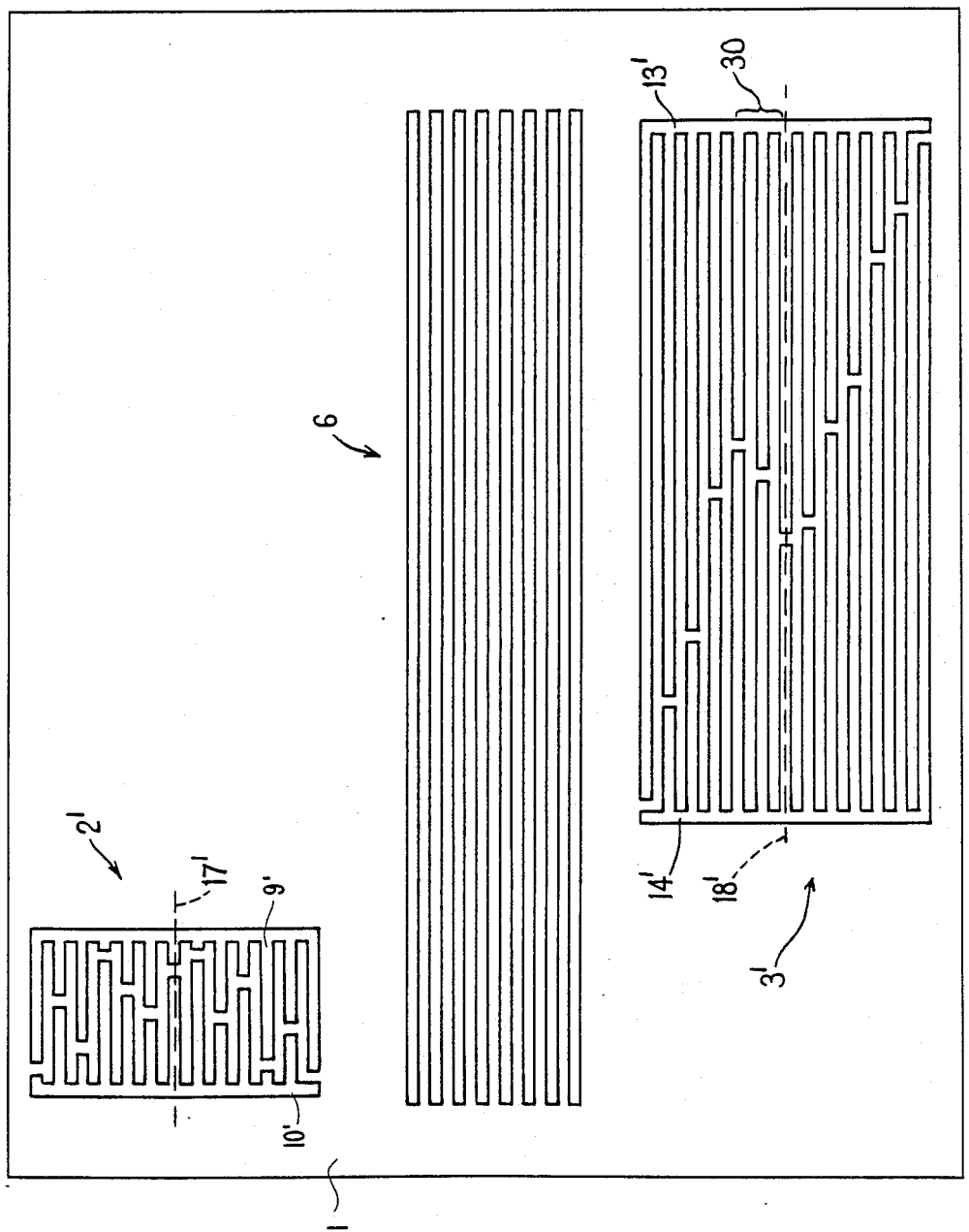

Such a method provides a very convenient way of ascertaining how the transducers can be apodized to obtain the required collective contribution to the overall transfer function. A very simple embodiment of the invention will now be described, by way of example, with reference to the accompanying diagammatic drawings, in which:

FIG. 1 shows the known type of electrical filter discussed above,

FIG. 2 shows the distribution in the $z^{-1}$ plane of the zeros of a transfer function corresponding to a possible required collective contribution of the two transducers of the filter of FIG. 1 to the overall filter characteristic, FIG. 3 shows the frequency response characteristics of the transducers in the filter of FIG. 1 when each implements alternate ones of the zeros of FIG. 2, FIG. 4 shows the distribution in the $z^{-1}$-plane of the zeros of the transfer function corresponding to the required collective contribution of two transducers to the overall gain versus frequency characteristic of one embodiment of the invention, FIG. 5 shows the gain versus frequency characteristic corresponding to the transfer function which has the zeros shown in FIG. 4, FIG. 6 shows the frequency response characteristics of the two transducers in the said embodiment of the invention, and FIG. 7 shows the electrode configuration in the said embodiment of the invention.

FIG. 4 shows the distribution in the $z^{-1}$-domain of the twenty-two zeros of the transfer function $z^{-22} + 2.9031\ z^{-20} + 3.2884\ z^{-18} + 0.9664\ z^{-16} - 0.4631\ z^{-14} + 0.8147 z^{-12} - 0.8147\ z^{-10} + 0.4631 z^{-8} - 0.9664\ z^{-6} - 3.2884\ z^{-4} - 2.9031\ z^{-2} - z^{0}$, which transfer function it is required in the present example be implemented by means of two apodized transducers in an electrical filter employing a surface acoustic wave device. z is the z-transform and is equal to $e^{jwT}$, where $w = 2\pi f$ and T is the time taken for surface acoustic waves to travel from a point midway between each active pair of transducer electrodes in the device to a point midway between the adjacent active pair of transducer electrodes and is therefore equal to $d/v$, where d is the distance between these points and v is the velocity of surface acoustic waves in the material of the piezoelectric substrate of the device (taking into account the loading effect of the transducer electrodes). d will normally be chosen to be equal to $\lambda_o/2$ or $\lambda_o/4$, where $\lambda_o$ is the length of surface acoustic waves which would be launched at the surface of the substrate by one of the transducers should an electrical signal having a frequency equal to the required centre-frequency $f_o$ of the pass-band of the device be applied to that transducer.

This transfer function is derived from a particular (in the present case symmetrical bandpass) optimum required collective contribution of the two transducers to the overall gain versus frequency characteristic of the filter together with the maximum permissible deviations therefrom by, for example, the method set forth in the aforementioned article by Morimoto et al., i.e. by first determining the minimum number of powers of $z^{-1}$ required to implement the required contribution without the maximum permissible deviations therefrom being exceeded, this being done in the manner described by L. R. Rabiner, J. F. Kaiser, O. Herrmann and M. T. Doran in The Bell System Technical Journal, Vol. 53, No. 2, 1974, page 305 et. seq. and by F. Mintzer and B. Liu in IEEE Trans., Vol. ASSP-27 No. 2, 1974, page 204 et. seq., and then determining the coefficients of the various powers of $z^{-1}$ by the so-called Remetz-Exchange Method referred to previously. It will be noted that, in contradistinction to the plot shown in FIG. 2 in which those zeros which do not lie on the unit circle are clustered around the real axis $Re(z^{-1})$, these zeros are now clustered around the imaginary axis $Im(z^{-1})$. This is because in the present case it is intended that the transfer function be implemented by means of a SAW device including a pair of apodised transducers in which the pitch of the electrodes is $\lambda_o/4$, where $\lambda_o$ is as defined above, in contrast to the device to which FIG. 2 relates, which is assumed to include transducers having an electrode pitch of $\lambda_o/2$.

The said twenty-two zeros are obtained in known manner by factorizing the transfer function, and have the values set out below:

$z_0^{-1} = 1 + 0j$
$z_1^{-1} = 0.9238 - 0.3826j$
$z_2^{-1} = 0.7071 - 0.7071j$
$z_3^{-1} = 0.3061 - 0.7391j$
$z_4^{-1} = 0.4783 - 1.1548j$
$z_5^{-1} = 0 - 0.8j$
$z_6^{-1} = 0 - 1.25j$
$z_7^{-1} = -0.3061 - 0.7391j$
$z_8^{-1} = -0.4783 - 1.1548j$
$z_9^{-1} = 0.7071 - 0.7071j$
$z_{10}^{-1} = 0.9238 - 0.3826j$
$z_{11}^{-1} = -1 - 0j$ together with the complex conjugates of these values. In this very simple example the zeros are spaced at equal angles of qb 22.5° around the origin. Moreover it will be noted that each zero which does not lie on the unit circle is accompanied by another zero which lies on the same ray from the origin and has a spacing from the origin which is such that the product of the spacings from the origin of each such pair is unity. (In fact the spacings of the zeros $z_3^{-1}$, $z_5^{-1}$ and $z_7^{-1}$ from the origin are each 0.8, and the spacings of the zeros $z_4^{-1}$, $z_6^{-1}$ and $z_8^{-1}$ from the origin are each 1.25). This is necessary in order that the transfer function be of the linear-phase (constant delay with varying frequency) type. The gain G versus frequency f characteristic of the transfer function (quoted above) to which the zeros plotted in FIG. 4 correspond is plotted as the continuous line 27 in FIG. 5 for frequencies around the centre-frequency $f_o$. It will be seen that the pass band portion of the characteristic exhibits three minima which correspond to the zero pairs $z_3^{-1}$ and $z_4^{-1}$, $z_5^{-1}$ and $z_6^{-1}$, and $z_7^{-1}$ and $z_8^{-1}$ together with their complex conjugates, respectively, and the stop-band portions each exhibit three nulls, which correspond to the zeros $z_0^{-1}$, $z_1^{-1}$ and $z_2^{-1}$, and $z_9^{-1}$, $z_{10}^{-1}$ and $z_{11}^{-1}$, together with their complex conjugates respectively. If the transfer function were obtained by means of two apodized transducers in the known way, i.e. in such manner that the zeros $z_1^{-1}$, $z_3^{-1}$, $z_4^{-1}$, $z_7^{-1}$, $z_8^{-1}$ and $z_{10}^{-1}$ together with their complex conjugates are implemented in one and the zeros $z_0^{-1}$, $z_2^{-1}$, $z_5^{-1}$, $z_6^{-1}$, $z_9^{-1}$ and $z_{11}^{-1}$ together with their complex conjugates are implemented in the other, the contributions of the transducers to the characteristic 27 would be of the forms (not to the same scale as curve 27) indicated by the dashed lines 25 and 26 respectively, from which it will be seen that these contributions would not be very equal, in particular because the pass-band corresponding to curve 25 is considerably wider than that corresponding to curve 26. As mentioned previously this is undesirable, in particular because relatively sharp transitions in the characteristics are liable to be accompanied by relatively large deviations from the transfer function which should theoretically be obtained. Moreover the occurrence of such sharp transitions is likely to make the relevant transducer highly reactive. In the example under consideration it would be much better if the characteristic 27 could be obtained from two contributions neither of which entails a pass-band as narrow as that corresponding to curve 26, for example by arranging that both contributions have corresponding pass-bands which have a width mid-way between the widths of the pass-bands of characteristics 25 and 26 and the centre-frequencies of which are suitably displaced relative to each other (so that the pass-band of one extends between $f_1'$ and $f_u$ in FIG. 5 and the pass-band of the other extends between $f_1$ and $f_u'$). This would entail that zero $z_2^{-1}$ in FIG. 4 together with its complex conjugate be implemented in one transducer and zero $z_9^{-1}$ together with its complex conjugate be implemented in the other. If this were done and if both transducers were of the linear-phase type as in the known filters, implying that the zeros of the pair $z_3^{-1}$, $z_4^{-1}$ are both implemented in the same transducer, as are the zeros of the pairs $z_5^{-1}$, $z_6^{-1}$ and $z_7^{-1}$, $z_8^{-1}$, at least three zeros which are not more than 22.5° apart in FIG. 4 would have to be implemented in the same transducer, again giving rise to relatively sharp transitions in, and considerable inequality between, the two characteristics. However, now it has been recognised that the two transducers in a SAW filter need not each be of the linear-phase type if they are non-identical and the collective contribution thereby to the overall characteristic of the filter is to be linear-phase. Accordingly, in one embodiment of the invention the zeros $z_0^{-1}$, $z_2^{-1}$, $z_3^{-1}$, $z_6^{-1}$, $z_7^{-1}$ and $z_{10}^{-1}$ of FIG. 4 together with their complex conjugates (where present) are implemented in one transducer and the zeros $z_1^{-1}$, $z_4^{-1}$, $z_5^{-1}$, $z_8^{-1}$, $z_9^{-1}$ and $z_{11}^{-1}$ together with their complex conjugates (where present) are implemented in the other, giving rise to the contributions (not to the same scale as curve 27) indicated by the dashed lines 28 and 29 respectively in FIG. 6 to the overall characteristic 27.

The physical characteristics of the two transducers, i.e. how they are to be apodized to obtain the desired performance characteristics, are obtained by forming for each a product similar to that given by expression (2) above, using the zeros assigned to the particular transducer. Thus the product for one transducer is given by $(z^{-1} - z_0^{-1})(z^{-1} - z_2^{-1})(z^{-1} - (z_2^{-1})^*)(z^{-1} - z_3^{-1})(z^{-1} - (z_3^{-1})^*) \ldots \ldots (z^{-1} - (z_{10}^{-1})^*)$ and that for the other is given by $(z^{-1} - z_1^{-1})(z^{-1} - (z_1^{-1})^*)(z^{-1} - z_4^{-1})(z^{-1} - (z_4^{-1})^*) \ldots (z^{-1} - z_{11}^{-1})$ These give the polynomials $z^{-11} - 0.5666z^{-10} + 1.4212z^{-9} - 0.3518z^{-8} - 0.1916z^{-7} + 0.5485z^{-6} + 0.1299z^{-5} - 0.9219z^{-4} + 0.3637z^{-3} - 1.1541z^{-2} + 0.3625z^{-1} - 0.6398z^0$ and $z^{-11}+0.5666z^{-10}+1.8933z^{-9}+0.6192z^{-8}+1.4095z^{-7}+0.1407z^{-6}-0.8663z^{-5}-0.2693z^{-4}+0.5823z^{-3}+2.2782z^{-2}+0.8852z^{-1}+1.5623z^{0}$ respectively. First and second apodized transducer interdigital electrode configurations are then formed on a piezo-electric substrate in such manner that the relative weights of the elementary surface acoustic wave sources or detectors formed by the (in this case twelve) successive active electrode pairs of the first transducer are directly proportional to the magnitudes of the coefficients of the successively increasing powers (including zero) of $z^{-1}$ in the first product, i.e. to 0.6398, 0.3625, 1.1541, 0.3637, 0.9219, 0.1299, 0.5485, 0.1916, 0.3518, 1.4212, 0.5666 and 1.0000 respectively, and the relative weights of the elementary surface acoustic wave detectors or sources formed by the (in this case twelve) successive active electrode pairs of the second transducer are directly proportional to the successively increasing powers (including zero) of $z^{-1}$ in the second product, i.e. to 1.5623, 0.8852, 2.2782, 0.5823, 0.2693, 0.8663, 0.1407, 1.4095, 0.6192, 1.8933, 0.5666 and 1.0000 respectively, and in such manner that the relative polarities of the successive active electrode pairs correspond to the signs of the corresponding coefficients. The active electrode pairs the relative weights of which are proportional to the coefficients of $z^0$ in the two products occur at the cooperating ends of the respective transducers. How to obtain specific relative weights will be known to those skilled in the art. The weight of a given active electrode pair is related to the overlap between the electrodes constituting that pair. However, it is not directly proportional thereto because it is influenced by the overlaps between the electrodes constituting the neighbouring electrode pairs and, to obtain a specific relative weight for a given active electrode pair, the overlaps between the electrodes constituting the, for example, twelve, neighbouring active electrode pairs must be taken into account.

Transducer electrode configurations corresponding to the above, but without taking into account the modifications to the electrode overlaps necessitated by the magnitudes of the neighbouring overlaps, are shown diagrammatically on a piezoelectric substrate 1 at 2' and 3' respectively in FIG. 7 of the drawings, together with the configuration of a (wide-band) multi-strip coupler 6 for directing acoustic surface wave energy emerging from the output aperture of transducer 2' to the input aperture of transducer 3'. (In fact coupler 6 will comprise many more strips than the eight shown). The transducer and coupler electrodes all have a pitch of $\lambda_o/4$ where $\lambda_o$ is the length of surface acoustic waves which are launched by transducer 2' at the surface of the piezo-electric substrate (not shown) on which the electrodes are provided when an electric signal having a frequency equal to the required centre-frequency $f_o$ of the passband shown at 27 in FIG. 6 is applied to transducer 2'. In fact the various electrodes have widths and spacings of $\lambda_o/8$.

It will be noted that the apodization of transducer 2' between bus bar 9', 10' is not symmetrical about the middle 17' of that transducer, nor is the apodization of transducer 3' symmetrical about the middle 18' of that transducer, i.e. both transducers have non-linear phase characteristics. However their apodizations differ from each other in such a way that their phase characteristics are mutually complementary.

The electrodes constituting the various active pairs in the transducers are connected to the transducer bus-bars with such relative polarities as to accord with the signs of the corresponding coefficients in the corresponding polynomials. For example, whereas in transducer 3' the overlapping electrodes constituting the majority of the successive active electrode pairs are connected to the bus-bars 13' and 14' respectively on going away from the coupler 6, those of the two active pairs indicated by the bracket 30 (which correspond to the coefficients $-0.8663$ and $-0.2693$ in the second polynomial of the pair quoted above) are connected to the bus-bars 14' and 13' respectively on going away from the coupler 6.

As mentioned previously, the coupler 6 (which may itself contribute to the overall gain versus frequency characteristic of the filter) is provided to transform the spatially weighted acoustic wavefront generated by the input transducer 2' to a spatially uniform but amplitude weighted acoustic wave for reception by the output transducer 3', in order that the collective contribution of the gain versus frequency characteristics of the two transducers to the overall gain versus frequency characteristic of the filter will be substantially equal to the product of the gain versus frequency characteristics of the two transducers as required. Another way of achieving this result is to omit the coupler 6, align the two transducers, and construct each transducer in such manner that the electrode/bus-bar configuration formed thereby functions as an acoustic surface wave-guide which will only propagate and transduce a single acoustic surface wave guided energy mode which is symmetrical about the central propagation axis of the array. Such a transducer construction is described and claimed per se in U.S. Pat. No. 4,513,262 and European patent application Ser. No. 83201308.0. If such transducers are employed it should be borne in mind that the relationship of the weight of a given active electrode pair to the overlap between the electrodes constituting that pair is rather more complicated than in the case of conventional transducers, it being related to $\sin(kZ_i)/k$ rather than $Z_i$ itself, where $Z_i$ is the distance between the break in a relevant electrode and the central propagation axis of the array and k is a parameter determined by the piezo-electric substrate. The parameter k is a function of the orientation of the material of the substrate and of the guide width and only varies very slowly with frequency.

It should be noted that, because of the mathematical properties of polynomials, the two sets of coefficients giving the required weights of the successive active electrode pairs in the transducers 2' and 3' may, as an alternative, be derived from the desired overall transfer function (calculated in terms of the z-transform) in a slightly different manner to that described above. More particularly, the desired overall transfer function may first be multiplied by $z^P$, where $-p$ is the highest power of z in the desired overall transfer function ($-22$ in the embodiment described) so that a polynomial in z rather than $z^{-1}$ is obtained. If the roots of the resulting polynomial are found, these will be equal to the reciprocals of the roots of the corresponding polynomial in $z^{-1}$. These roots may then be divided into two groups in a manner exactly analogous to that described for the roots of the polynomial in $z^{-1}$ and the two polynomials the roots of which are those of the respective groups be calculated by multiplying out the relevant factors. If this is done it will be found that two sets of coefficients are obtained which correspond exactly to those found by the method first described.

Although the invention has been described with reference to an example in which the two transducers in a band-pass filter are made to contribute more equally to the overall gain versus frequency characteristic, it will be evident that the extra flexibility obtained by making both transducers of a non-linear-phase type but with complementary phase characteristics will enable a corresponding advantage to be obtained in many filters having other forms of gain versus frequency characteristic. Moreover this flexibility may in addition or alternatively enable other advantages to be obtained, for example reduced apodization loss in one or both transducers.

We claim:

1. An electrical filter comprising an acoustic surface wave device, said device comprising a piezo-electric substrate for propagating acoustic surface waves at a surface thereof, a first electro-acoustic transducer on said surface for launching acoustic surface waves along a propagation path at said surface, a second electro-acoustic transducer on said surface for receiving acoustic surface waves propagating along said path, each transducer comprising an interdigital array of electrodes which extend at right angles to the propagation path where said path adjoins the relevant transducer and each transducer being apodized so as to shape the gain versus frequency characteristic of the filter while maintaining the delay imparted by the filter substantially independent of frequency, the collective contribution of the gain versus frequency characteristics of the two transducers to the overall gain versus frequency characteristic of the filter being substantially equal to the product of the gain versus frequency characteristics of the two transducers, characterised in that the apodization of each transducer is non-symmetrical about the middle of the corresponding transducer so that each transducer has a non-linear phase characteristic and each transducer is apodized differently from the other such that the gain versus frequency characteristic of each transducer is different and the phase characteristic of each transducer is the complement of that of the other transducer.

2. A filter as claimed in claim 1, characterised in that the pitch of the electrodes of each transducer is equal to one quarter of the wavelength of surface acoustic waves launched at said surface by said first transducer by an applied electrical signal having a frequency equal to the centre-frequency of the pass band of said filter.

3. A method of manufacturing an electrical filter of the type defined in claim 1 comprising the steps of calculating in terms of the z-transform a linear-phase transfer function which corresponds to a gain versus frequency characteristic which is the collective contribution to the desired overall gain versus frequency characteristic of the filter, finding N roots, or reciprocals of the N roots, of a polynomial in $z^{-1}$ which constitutes said transfer function, arranging the N roots or reciprocals thus found into a first group of L roots or reciprocals and a second group of M roots or reciprocals in such manner that the first and second groups are non-identical and the members of at least one pair of non-identical roots or reciprocals which have equal ratios between their real and imaginary parts and the product of the moduli of which is equal to unity are included one in each group and the roots or reciprocals of each conjugate pair are both included in the same group, forming first and second further polynomials the roots or the reciprocals of the roots of which are constituted by those of the first group and those of the second group respectively, and forming the first and second electro-acoustic transducers with L+1 and M+1 active electrode pairs respectively and apodized so that the relative weights of elementary surface acoustic wave sources formed by the successive active pairs of the first transducer and the relative weights of elementary surface acoustic wave detectors formed by the successive active pairs of the second transducer are directly proportional to the magnitudes of the coefficients of the successively increasing powers, including zero, of the variable in the first further polynomial and the magnitudes of the coefficients of the successively increasing powers, including zero, of the variable in the second further polynomial respectively and the relative polarities of said active pairs conform with the signs of the corresponding said coefficients.

4. An electrical filter manufactured by a method as claimed in claim 3.

5. A filter as claimed in claim 1 wherein said first and second transducers are non-aligned, said filter further comprising a multistrip coupler comprising an array of electrodes, part of which overlap a propagation path of the first transducer and another part of which overlap a propagation path of the second transducer, said array of electrodes of the multistrip coupler being arranged to provide a linear-phase characteristic for the multistrip coupler.

6. A filter as claimed in claim 5 wherein the electrodes of each transducer and of the multistrip coupler all have a pitch of $\lambda_0/4$, where $\lambda_0$ is the wavelength of surface acoustic waves launched by the first transducer at the center frequency $f_0$ of the filter pass band.

7. An acoustic surface wave device comprising, a substrate capable of propagating acoustic surface waves at a surface thereof, a first transducer on said surface for launching acoustic surface waves along a first propagation path at said surface, a second transducer on said surface for receiving acoustic surface waves propagating along a second path at said surface, each transducer comprising an interdigital array of electrodes extending at right angles to its respective propagation path, the electrodes of the first and second transducers being arranged in different apodization patterns with each apodization pattern being non-symmetrical about the middle of the respective transducer so that the two transducers have mutually complementary non-linear phase characteristics such that the device exhibits an overall linear-phase characteristic, and wherein the overall gain versus frequency characteristic of the device is substantially equal to the product of the individual gain versus frequency characteristics of the first and the second transducers.

8. A device as claimed in claim 7 wherein said transducers are located so that the first and second propagation paths are parallel but non-aligned, said device further comprising a multistrip coupler having an array of electrodes interposed across the first and second propagation paths and orthogonal thereto so as to couple acoustic surface wave energy from the first path to the second path.

9. A device as claimed in claim 7 operative as an electric filter wherein the collective contribution of the two transducers thereof to the overall filter characteristic has a transfer function as shown by the distribution of zeroes in the $z^{-1}$ domain in FIG. 4 of the drawing.

10. A method of making an acoustic surface wave filter device including first and second transducers on a piezoelectric substrate and with different transducer apodization patterns that provide each transducer with a non-linear phase characteristic but with mutually complementary phase characteristics such as to produce a filter device with an overall linear-phase characteristic, said method comprising the following steps: calculating in terms of the z-transform a linear-phase transfer function which corresponds to a gain versus frequency characteristic which is the collective contribution of the two transducers to the desired overall gain versus frequency characteristic of the filter, finding N roots of a polynomial in $z^{-1}$ which constitutes said transfer function, separating dividing the N roots into a first group of L roots and a second group of M roots so that the elements of at least one pair of non-identical roots which have equal ratios between their real and imaginary parts and the product of the moduli of which is equal to unity are included one in each group and the roots of each conjugate pair are both included in the same group, forming first and second further polynomials having roots constituted by those of the first group and those of the second group, respectively, and forming the first and second transducers with $L+1$ and $M+1$ active electrode pairs respectively and apodized so that the relative weights of elementary surface acoustic wave sources formed by the successive active pairs of the first transducer and the relative weights of elementary surface acoustic wave detectors formed by the successive active pairs of the second transducer are directly proportional to the magnitudes of the coefficients of the successively increasing powers (including zero) of the variable in the first further polynomial and the magnitudes of the coefficients of the successively increasing powers (including zero) of the variable in the second further polynomial respectively, and the relative polarities of said active pairs conform with the signs of the corresponding said coefficients.

11. A method of making an acoustic surface wave filter device including first and second transducers on a piezoelectric substrate and with different transducer apodization patterns that provide each transducer with a non-linear phase characteristic but with mutually complementary phase characteristics such as to produce a filter device with an overall linear-phase characteristic, said method comprising the following steps: calculating in terms of the z-transform a linear-phase transfer function which corresponds to a gain versus frequency characteristic which is the collective contribution of the two transducers to the desired overall gain versus frequency characteristic of the filter, finding the reciprocals of the N roots of a polynomial in $z^{-1}$ which constitutes said transfer function, separating the reciprocals into a first group of L reciprocals and a second group of M reciprocals so that the elements of at least one pair of non-identical reciprocals which have equal ratios between their real and imaginary parts and the product of the moduli of which is equal to unity are included one in each group and the reciprocals of each conjugate pair are both included in the same group, forming first and second further polynomials having reciprocals constituted by those of the first group and those of the second group, respectively, and forming the first and second transducers with $L+1$ and $M+1$ active electrode pairs respectively and apodized so that the relative weights of elementary surface acoustic wave sources formed by the successive active pairs of the first transducer and the relative weights of elementary surface acoustic wave detectors formed by the successive active pairs of the second transducer are directly proportional to the magnitudes of the coefficients of the successively increasing powers (including zero) of the variable in the first further polynomial and the magnitudes of the coefficients of the successively increasing powers (including zero) of the variable in the second further polynomial respectively, and the relative polarities of said active pairs conform with the signs of the corresponding said coefficients.

* * * * *